United States Patent
Bean, Jr. et al.

(10) Patent No.: US 8,031,468 B2
(45) Date of Patent: Oct. 4, 2011

(54) HOT AISLE CONTAINMENT COOLING UNIT AND METHOD FOR COOLING

(75) Inventors: John H. Bean, Jr., Wentzville, MO (US); Zhihai Gordon Dong, Chesterfield, MO (US)

(73) Assignee: American Power Conversion Corporation, West Kingston, RI (US)

( * ) Notice: Subject to any disclaimer, the term of this patent is extended or adjusted under 35 U.S.C. 154(b) by 214 days.

(21) Appl. No.: 12/477,638

(22) Filed: Jun. 3, 2009

(65) Prior Publication Data

US 2010/0307716 A1 Dec. 9, 2010

(51) Int. Cl.
*H05K 7/20* (2006.01)
*G06F 1/20* (2006.01)

(52) U.S. Cl. .............. 361/696; 361/679.47; 361/679.48; 361/679.49; 361/679.53; 361/679.54; 361/695; 361/698; 361/699; 361/701; 361/704; 165/104.33; 165/176; 165/185; 454/184

(58) Field of Classification Search .. 361/679.47–679.5, 361/679.53–679.54, 694–696, 698–699, 361/701, 704; 165/104.33, 176, 185; 454/184
See application file for complete search history.

(56) References Cited

U.S. PATENT DOCUMENTS

| | | | |
|---|---|---|---|
| 2,060,582 A | 11/1936 | Leffert | |
| 3,791,089 A | 2/1974 | Alderman | |
| 4,063,431 A * | 12/1977 | Dankowski | 62/239 |
| 4,083,245 A | 4/1978 | Osborn | |
| 4,138,857 A * | 2/1979 | Dankowski | 62/239 |
| 5,028,087 A | 7/1991 | Ells | |
| 5,259,206 A * | 11/1993 | Dankowski | 62/507 |
| 5,879,232 A | 3/1999 | Luter, II et al. | |
| 6,034,873 A | 3/2000 | St.ang.hl et al. | |
| 6,199,337 B1 | 3/2001 | Colson et al. | |
| 6,343,011 B1 | 1/2002 | Yu | |
| 6,668,565 B1 | 12/2003 | Johnson et al. | |
| 6,672,955 B2 | 1/2004 | Charron | |
| 6,732,789 B2 * | 5/2004 | Jang | 165/110 |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |

(Continued)

FOREIGN PATENT DOCUMENTS

DE 20014274 U1 11/2000

(Continued)

OTHER PUBLICATIONS

Rotheroe et al., "Hot aisle based heat removal unit", RD545030, Hewlett-Packard Co., Sep. 2009.*

(Continued)

*Primary Examiner* — Robert J Hoffberg
(74) *Attorney, Agent, or Firm* — Lando & Anastasi, LLP

(57) ABSTRACT

A cooling unit, which is configured to contain and cool air between two rows of equipment racks defining a hot aisle, includes a housing configured to be secured mounted on the two rows of equipment racks such that the housing spans the hot aisle, a heat exchanger supported by the housing and coupled to and in fluid communication with a coolant supply and a coolant return, and an air movement assembly supported by the housing and configured to move air over the heat exchanger. Other embodiments of the cooling unit and methods of cooling are further disclosed.

11 Claims, 10 Drawing Sheets

U.S. PATENT DOCUMENTS

| | | |
|---|---|---|
| 7,046,514 B2 | 5/2006 | Fink et al. |
| 7,140,193 B2 | 11/2006 | Johnson et al. |
| 7,145,772 B2 | 12/2006 | Fink |
| 7,165,412 B1 | 1/2007 | Bean, Jr. |
| 7,173,820 B2 | 2/2007 | Fink et al. |
| 7,259,963 B2 | 8/2007 | Germagian et al. |
| 7,278,273 B1 | 10/2007 | Whitted et al. |
| 7,293,666 B2 | 11/2007 | Mattlin et al. |
| 7,325,410 B1 | 2/2008 | Bean, Jr. |
| 7,372,695 B2 | 5/2008 | Coglitore et al. |
| 7,403,391 B2 | 7/2008 | Germagian et al. |
| 7,430,118 B1 | 9/2008 | Noteboom et al. |
| 7,508,663 B2 | 3/2009 | Coglitore |
| 7,508,666 B1 | 3/2009 | Henneberg et al. |
| 7,511,960 B2 | 3/2009 | Hillis et al. |
| 7,551,971 B2 | 6/2009 | Hillis |
| 7,643,285 B2 * | 1/2010 | Nishiyama et al. ...... 361/679.49 |
| 7,646,590 B1 | 1/2010 | Corhodzic et al. |
| 7,724,518 B1 | 5/2010 | Carlson et al. |
| 7,800,900 B1 | 9/2010 | Noteboom et al. |
| 7,856,838 B2 | 12/2010 | Hillis et al. |
| 2003/0050003 A1 | 3/2003 | Charron |
| 2004/0184232 A1 | 9/2004 | Fink |
| 2005/0011637 A1* | 1/2005 | Takano ......................... 165/144 |
| 2005/0209740 A1* | 9/2005 | Vann ............................. 700/300 |
| 2005/0280986 A1 | 12/2005 | Coglitore et al. |
| 2006/0260338 A1 | 11/2006 | VanGilder et al. |
| 2006/0283111 A1 | 12/2006 | Ayers et al. |
| 2007/0084589 A1* | 4/2007 | Nishino et al. ................ 165/152 |
| 2007/0146994 A1 | 6/2007 | Germagian et al. |
| 2007/0167125 A1 | 7/2007 | Rasmussen et al. |
| 2007/0262606 A1 | 11/2007 | Schnoblen et al. |
| 2008/0043426 A1* | 2/2008 | Nishiyama et al. ........... 361/687 |
| 2008/0060372 A1 | 3/2008 | Hillis et al. |
| 2008/0185446 A1 | 8/2008 | Tozer |
| 2008/0291626 A1 | 11/2008 | Nelson et al. |
| 2009/0014397 A1 | 1/2009 | Moss et al. |
| 2009/0046427 A1 | 2/2009 | Noteboom et al. |
| 2009/0086428 A1 | 4/2009 | Campbell et al. |
| 2009/0241578 A1 | 10/2009 | Carlson et al. |
| 2009/0251860 A1 | 10/2009 | Belady et al. |
| 2009/0255653 A1 | 10/2009 | Mills et al. |
| 2009/0319650 A1 | 12/2009 | Collins et al. |
| 2010/0061057 A1 | 3/2010 | Dersch et al. |
| 2010/0188816 A1* | 7/2010 | Bean et al. .................... 361/696 |
| 2010/0230058 A1 | 9/2010 | Mahoney |
| 2010/0300648 A1 | 12/2010 | Grantham |
| 2010/0307716 A1 | 12/2010 | Bean, Jr. et al. |
| 2010/0315775 A1 | 12/2010 | Grantham et al. |

FOREIGN PATENT DOCUMENTS

| | | |
|---|---|---|
| DE | 20 2004 003309 U1 | 8/2004 |
| DE | 202008010718 U1 | 2/2009 |
| EP | 0033182 A2 | 8/1981 |
| EP | 1 069 381 A1 | 1/2001 |
| JP | 2003-166729 A | 6/2003 |
| JP | 2007316989 A | 12/2007 |
| JP | 2009097774 A | 5/2009 |
| JP | 2010122747 A | 6/2010 |
| SE | 456449 B | 10/1988 |
| WO | 9963797 A1 | 12/1999 |
| WO | 2007090804 A2 | 8/2007 |

OTHER PUBLICATIONS

Invitation to Pay Additional Fees and Partial International Search Report for PCT/US2009/053759 mailed Nov. 16, 2009.

American Power Conversion Coporation Brochure, "Hot Aisle Containment System (HACS)," 2008, pp. 1-68.

International Search Report for PCT/US2009/068506 mailed Apr. 8, 2010.

APC's InfraStruXure(R) Hot-Aisle Containment Systems a Key to Sun's New Energy Efficient Data Center, Press release of American Power Conversion Corporation, West Kingston, R.I., Oct. 16, 2007.

International Search Report for PCT/US2010/035092 dated Aug. 31, 2010.

"Inter-Rack Flow Seperator to Prevent Computer Rack Hot Exhaust Air Entry into Cold Region at Rack Inlet of Computer Data Center Facilities" IP.COM Journal, IP.COM INC., West Henrietta, NY, US, Jun. 20, 2006, XP013114636 ISSN: 1533-0001.

International Search Report for PCT/US2009/053759 mailed Apr. 9, 2010.

Invitation to Pay Additional Fees and Partial International Search Report for PCT/US2010/035212 mailed Oct. 5, 2010.

International Search Report for PCT/US2010/035418 mailed Aug. 17, 2010.

* cited by examiner

HOT AISLE CONTAINMENT COOLING UNIT AND METHOD FOR COOLING

RELATED APPLICATION

This application relates to U.S. Patent application Ser. No. 12/483,408, entitled METHOD AND APPARATUS FOR INSTALLATION AND REMOVAL OF OVERHEAD COOLING EQUIPMENT by Roy Grantham, filed on even date herewith, which is incorporated herein by reference in its entirety for all purposes.

BACKGROUND OF THE DISCLOSURE

1. Field of the Disclosure

The present disclosure relates to air cooling systems used to cool racks and enclosures, and more particularly to air cooling equipment used to cool racks and enclosures of the type used to house data processing, networking and telecommunications equipment.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Nineteen inch equipment racks are used extensively in data centers and other facilities. With the proliferation of the Internet, it is not uncommon for a data center to contain hundreds of these equipment racks.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

In order to control the flow of air throughout the data center, and to optimize the air flow as described above, it may be desirable to contain and cool the air within the hot and cold aisles, and in particular, the hot aisle. Examples of such a hot aisle air containment system may be found in U.S. Pat. Nos. 6,859,366 and 7,046,514, and in U.S. patent application Ser. No. 12/361,087, entitled HOT AISLE CONTAINMENT COOLING SYSTEM AND METHOD, by John Bean et al., filed on Jan. 28, 2009, which is incorporated herein by reference in its entirety for all purposes. Other examples of hot aisle containment systems are provided by American Power Conversion Corporation of West Kingston, R.I., the assignee of the present disclosure, under model nos. ACDC1014, ACDC1015, ACDC1018 and ACDC1019.

SUMMARY OF THE DISCLOSURE

One aspect of the disclosure is directed to a cooling unit for containing and cooling air between two rows of equipment racks defining a hot aisle. In one embodiment, the cooling unit comprises a housing configured to be secured mounted on the two rows of equipment racks such that the housing spans the hot aisle, a heat exchanger supported by the housing and coupled to and in fluid communication with a coolant supply and a coolant return, and an air movement assembly supported by the housing and configured to move air over the heat exchanger.

Embodiments of the cooling unit further include a first header coupled to the heat exchanger and the coolant supply. The first header is configured to distribute coolant to the heat exchanger. The cooling unit further includes a second header coupled to the heat exchanger and the coolant return. The air movement assembly includes at least one fan unit. The fan unit is separated from another fan unit by a partition plate. The heat exchanger comprises micro channel coils. The cooling unit further includes at least one light assembly module coupled to the housing and/or a remote control to control the operation of the cooling unit.

Another aspect of the disclosure is directed to a cooling unit comprising a first heat exchanger coupled to and in fluid communication with a coolant supply, the first heat exchanger including a body having a first surface and a second, opposing surface, and a second heat exchanger coupled to and in fluid communication with the first heat exchanger and a coolant return. The second heat exchanger includes a body having a first surface and a second, opposing surface. The arrangement is such that the first surface of the second heat exchanger faces the second surface of the first heat exchanger.

Embodiments of the cooling unit further include a first header coupled to the first heat exchanger and the coolant supply. The first header is configured to distribute coolant to the first heat exchanger. The cooling unit further comprises at least one intermediate coil connector disposed between the first heat exchanger and the second heat exchanger. The cooling unit further comprises a second header coupled to the second heat exchanger and the coolant return. The cooling unit further comprises an air movement assembly configured to move air over the first heat exchanger and the second heat exchanger. The air movement assembly includes a plurality of fan units. Each of the plurality of fan units is separated from one another by a partition plate.

Yet another aspect of the disclosure is directed to a method of cooling a hot aisle defined by two rows of equipment racks of a data center. In one embodiment, the method comprises: containing air within the hot aisle of the data center with one or more cooling units configured to span the hot aisle; and cooling air contained within the hot aisle by the cooling unit. Cooling air contained within the hot aisle includes moving air toward a heat exchanger of the cooling unit.

Embodiments of the method may include configuring the cooling unit to include a first heat exchanger including a body having a first surface and a second, opposite surface, and a second heat exchanger including a body having a first surface and a second, opposite surface. The arrangement is such that the first surface of the second heat exchanger faces the second surface of the first heat exchanger. Moving air toward the heat exchanger includes moving air toward the second heat exchanger through the second surface of the second heat exchanger and through the second surface of the first heat exchanger. The method further comprises illuminating the hot aisle and/or controlling the operation of the cooling unit with a remote control.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

Figure 1:
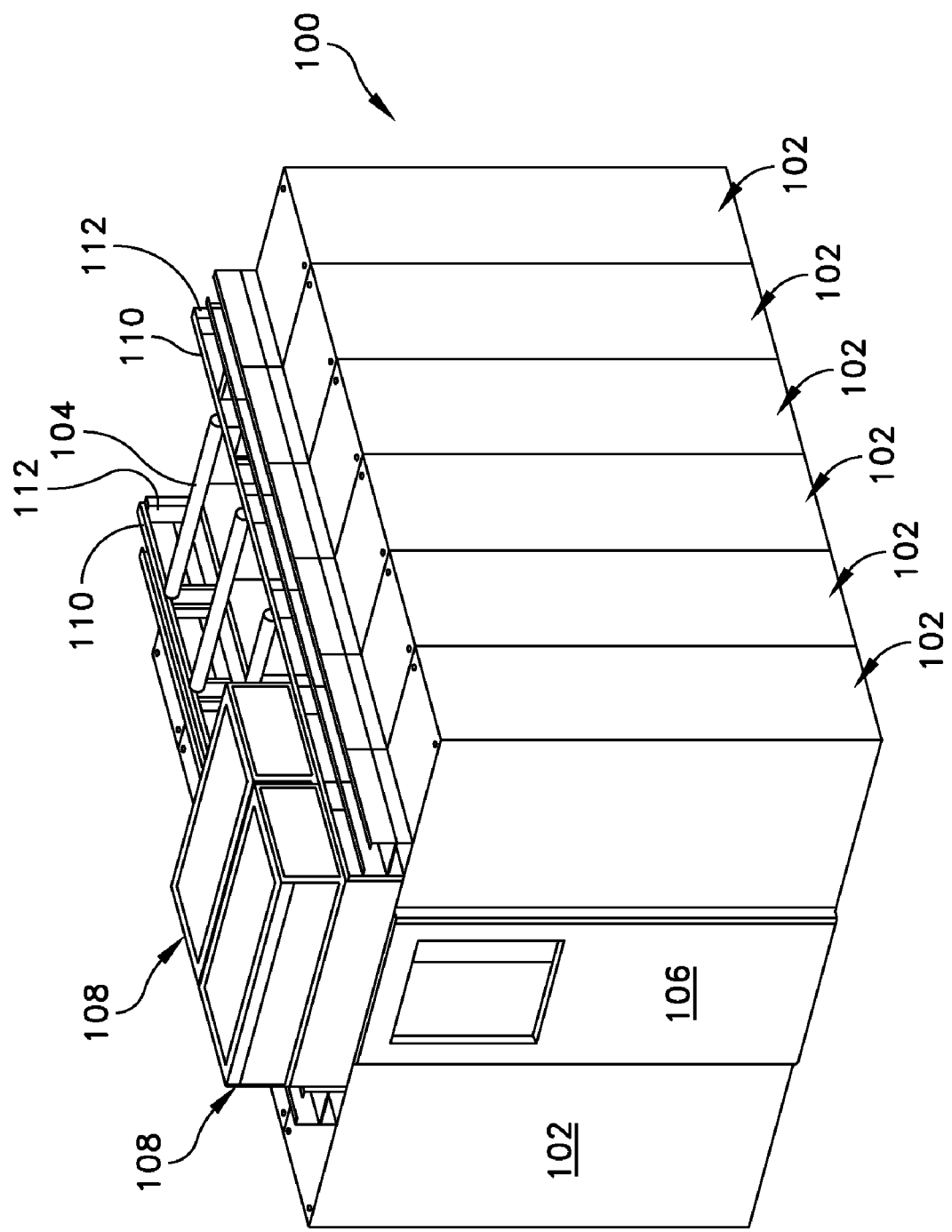
FIG. 1 is a perspective view of a portion of a data center showing a hot aisle defined by two rows of equipment racks and a cooling unit of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Other examples of equipment racks are sold by American Power Conversion Corporation under the brand name NetShelter™. Further, cabling between the equipment racks may be implemented using cable distribution troughs contained on the roofs of the racks as disclosed in U.S. Pat. No. 6,967,283, which is also incorporated herein by reference and assigned to the assignee of the present disclosure. The principles of the present disclosure may be adapted to smaller data centers, equipment rooms and computer rooms. The data center described herein is provided by way of example only.

Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Casters may be secured to the bottom of each equipment rack to enable the rack to roll along the floor of the data center. Once positioned, leveling feet may be deployed to securely ground the equipment rack in place within the row.

Once in position, electronic equipment may be positioned in the interior region of the equipment rack. For example, the equipment may be placed on shelving secured within the interior region of the equipment rack. In other embodiments, the electronic equipment may be provided within the equipment rack prior to the placement of the equipment rack within the data center. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, one or more cooling systems may be provided. In one configuration, the cooling system may be provided as part of the data center infrastructure. In another configuration, the data center's cooling system may be supplemented with the traditional CRAC units described above. With yet another configuration, a modular cooling system may be further provided.

Such a modular system is described in pending U.S. patent application Ser. No. 11/335,874, entitled COOLING SYSTEM AND METHOD, filed on Jan. 19, 2006, or in U.S. patent application Ser. No. 11/504,382, entitled METHOD AND APPARATUS FOR COOLING, filed on Aug. 15, 2006, both of which are owned by the assignee of the present disclosure and is incorporated herein by reference. The cooling system may include a plurality of cooling racks strategically disposed within the data center. In one embodiment, the arrangement may be such that there is a cooling rack for every two equipment racks provided in the data center. However, it should be understood that a person skilled in the art, and given the benefit of this disclosure, may provide more or less cooling racks within the data center depending on environmental conditions of the data center. Further in some embodiments, the concentration and locations of cooling racks may be adjusted based on the locations of the hottest racks in the data center, or based on information obtained and analyzed by a data center information management system and the type of equipment housed within the data center.

Details of the modular cooling system and its various components and configurations may be found in pending U.S. patent application Ser. Nos. 11/335,874 and 11/504,382. Also, the cooling system may embody other cooling configurations, such as those offered by American Power Conversion Corporation of West Kingstown, R.I., the assignee of the present disclosure.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

Embodiments of an air containment cooling system may include an air containment cooling system for containing and cooling air between two rows of equipment racks. In one embodiment, the air containment cooling includes a cooling unit configured to enclose a hot aisle defined by the two rows of equipment racks. In a certain embodiment, the cooling unit is configured to cool or otherwise condition air disposed within the hot aisle.

A data center cooling unit according to one example of the present disclosure is designed to be positioned above a hot aisle of an electronics equipment rack cluster. The hot aisle may be as narrow as about 36 inches wide, and in some embodiments about 48 inches wide. In a particular embodiment, the cooling unit may include a first heat exchanger coupled to and in fluid communication with a coolant supply and a second heat exchanger coupled to and in fluid communication with the first heat exchanger. The first heat exchanger includes a body having a first surface and a second, opposing surface. Similarly, the second heat exchanger includes a body having a first surface and a second, opposing surface. The arrangement is such that the first surface of the second heat exchanger faces the second surface of the first heat exchanger. Heated coolant produced by the first and second heat exchangers is exhausted by a coolant return coupled to and in fluid communication with the second heat exchanger. In other embodiments, the cooling unit may be configured with only one heat exchanger.

Embodiments of the cooling unit may further include a first header coupled to the first heat exchanger and the coolant supply. The first header is configured to distribute coolant to the first heat exchanger. The cooling unit may further include an intermediate coil header disposed between the first heat exchanger and the second heat exchanger to transfer coolant from the first heat exchanger to the second heat exchanger. A second header, coupled to the second heat exchanger and the coolant return, is provided to transfer heated coolant to the coolant return.

In other embodiments, the cooling unit further includes an air movement assembly configured to move air over the first heat exchanger and the second heat exchanger. In a particular embodiment, the air movement assembly includes a plurality of fan units, which are separated from one another by partition plates.

Referring to FIG. 1, there is illustrated a portion of a data center generally indicated at 100 according to an embodiment of the present disclosure. The portion of the data center 100 includes two rows of equipment racks, with each equipment rack being generally indicated at 102. Although illustrated as having solid walls, in some embodiments, as mentioned above, each equipment rack 102 has one or more vent holes (e.g., a perforated panel) provided in their front and/or back and/or upper walls in order to allow the passage of air through the equipment racks 102. In some alternate embodiments, one or more of the equipment racks 102 may be substituted by a filler unit or a cooling unit, which may be of substantially the same shape and size as the equipment racks 102. The two rows of equipment racks 102 define a hot aisle 104. In some embodiments, the hot aisle 104 is closed on one or more ends by a structure such as a door 106. Also illustrated in FIG. 1 is a cooling unit generally indicated at 108 mounted above a portion of the hot aisle 104. In one embodiment, the cooling unit 108 may be mounted on a pair of tracks 110. The tracks 110 are mounted on a number of supports 112. In alternate embodiments, more or fewer of tracks 110 may be utilized to support the cooling unit 108, and the tracks 110 may be positioned differently than as illustrated in the drawings. Additionally, the shapes and sizes of elements, such as the cooling unit 108, the equipment racks 102, the door 106, the supports 112, etc. are not meant to be limiting and in different embodiments may vary from what is illustrated. The manner in which the cooling unit is secured above the hot aisle may be found in the U.S. patent application Ser. No. 12/483,408, entitled METHOD AND APPARATUS FOR INSTALLATION AND REMOVAL OF OVERHEAD COOLING EQUIPMENT identified above.

As shown in FIG. 1, the cooling unit 108 is configured to span the distance above the hot aisle 104. Although only two cooling unit 108 are shown, multiple cooling units may be mounted on the tracks 110 to completely enclose the hot aisle 104. Filler panels (not shown) may be provided in place of cooling units 108. Additionally, one of the cooling units 108 may be placed by moving the cooling unit on top of the other cooling units. The cooling units 108 may be equipped with tracks on their upper sides that support other cooling units. The tracks may be spaced apart from one another by the same distance as the tracks 110. In use, providing for tracks on top of the cooling units 108 along which other cooling units may travel allows for a cooling unit from within a group of cooling units to be removed from the data center 100 without removing other cooling units that may be closer to one of the ends of the hot aisle 104 than the cooling unit being removed. This track system also allows for the positions of the cooling units 108 to be easily swapped, should the need arise. In addition, a facilities supply rack may be used to support conduits for water, power, air, or other utilities that may be connected to the cooling units 108 or to equipment within the equipment racks 102. Lifting mechanisms (not shown), such as ratchet assemblies, may, in some embodiments, be mounted on top of the row of equipment racks to facilitate lifting and lowering of the cooling units.

Figure 2:
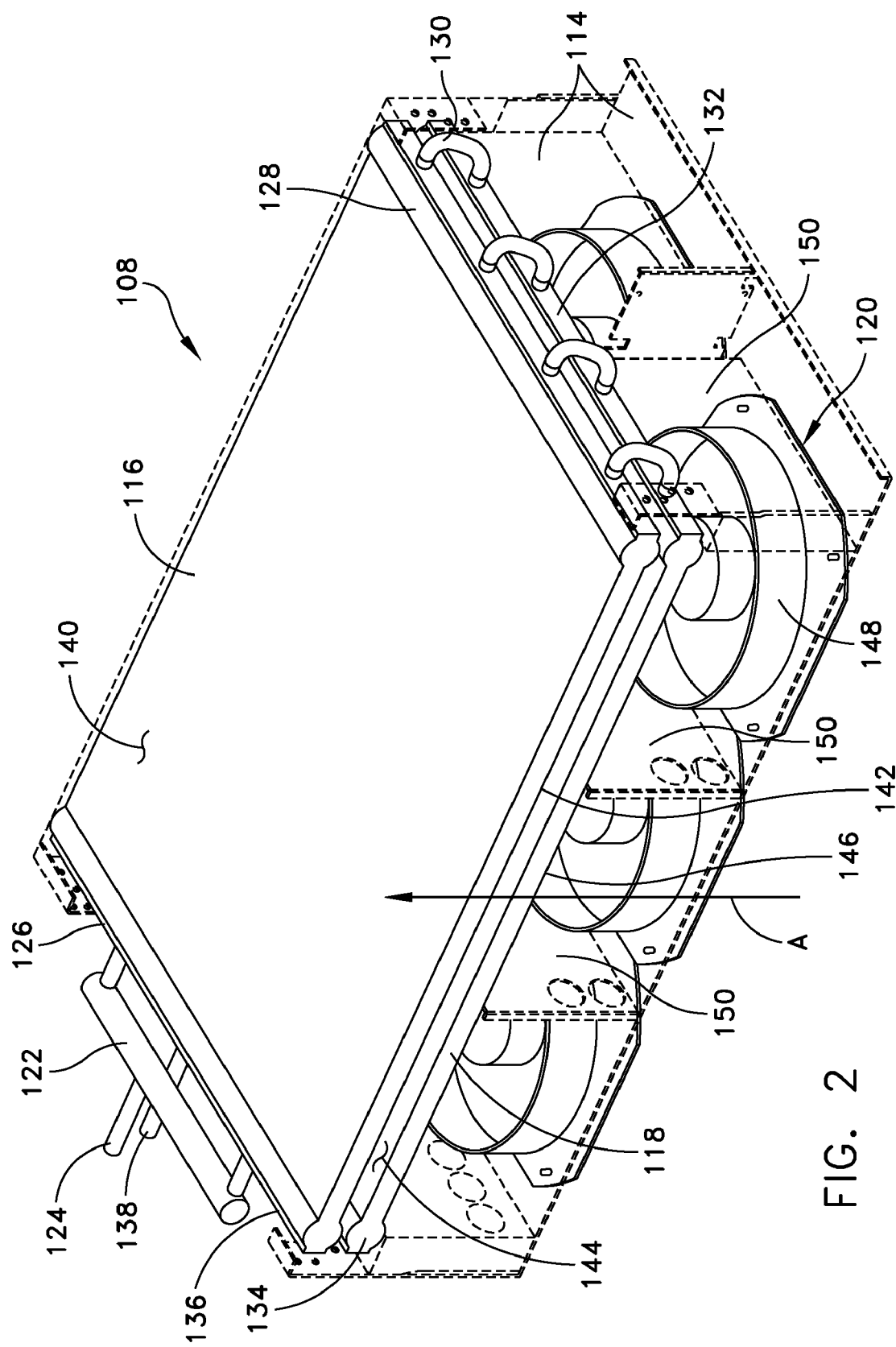
FIG. 2 is a perspective view of the cooling unit shown in FIG. 1.

A refrigerant distribution unit (not shown) may be provided to supply sub-cooled liquid refrigerant, such as R-134 a, to the cooling unit 108 by a supply line. As illustrated in FIG. 2, the cooling unit 108 comprises a housing 114 designed to secure the working components of the cooling unit. As shown, the cooling unit 108 includes a first heat exchanger 116, a second heat exchanger 118 in fluid communication with the first heat exchanger, and an air movement assembly generally indicated at 120, each of which are secured to the housing 114. In other embodiments, such as the embodiment shown in FIGS. 7-10, the cooling unit 108 includes only one heat exchanger. Refrigerant enters into a secondary dual inlet coil header 122 of the cooling unit 108 at a middle location by a refrigerant supply line 124, which may be connected to the refrigerant distribution unit. The refrigerant is pre-mixed in the secondary dual inlet coil header 122, and then is divided into two branches to flow into an inlet coil header manifold 126 of the cooling unit 108 at locations along the inlet coil header manifold. After further mixing in the inlet coil header manifold 126, refrigerant is uniformly distributed into micro channels of the first heat exchanger 116.

With cooling unit 108, once refrigerant enters the first heat exchanger 116, the refrigerant is partially evaporated in the first heat exchanger. The refrigerant travels through the first heat exchanger 116 until it reaches an outlet header manifold 128 provided at an exit of the first heat exchanger. The outlet header manifold 128 is in fluid communication with U-shape intermediate connectors 130, which transfer the two-phase mixture of refrigerant from the first heat exchanger into 116 an inlet coil header manifold 132 of the second heat exchanger 118. The delivery process provided by the outlet header manifold 128, the intermediate connectors 130 and the inlet coil header manifold 132 provides a fluent and smooth transfer of refrigerant between the first heat exchanger 116 and the second heat exchanger 118 without distribution issues, which may cause cooling performance issues with the second heat exchanger.

In the second heat exchanger 118, the refrigerant becomes a superheated gas at end of the second heat exchanger. The vaporized refrigerant is collected by an outlet header manifold 134 of the second heat exchanger 118, which is then transferred into a secondary dual outlet coil header 136 provided at the end of the second heat exchanger. A return line 138 is connected to the outlet coil header 136 of the second heat exchanger 118 to return the superheated gas to the refrigerant distribution unit. In one embodiment, an evaporator pressure regulating valve (not shown) is installed in the return line. The evaporator pressure regulating valve may be used to modulate the evaporating temperature above local air dew point temperature to avoid condensate generation on the coil surfaces of the first and second heat exchangers 116, 118.

Air flows through the cooling unit 108 from the bottom to the top of the cooling unit in a vertical direction defined by arrow A in FIG. 2. As shown, the first heat exchanger 116 includes a body having a first (upwardly facing) surface 140 and a second, opposing (downwardly facing as shown in FIG. 2) surface 142. Similarly, the second heat exchanger 118 includes a body having a first (upwardly facing) surface 144 and a second, opposing (downwardly facing) surface 146. The arrangement is such that the first surface 144 of the second heat exchanger 118 faces the second surface 142 of the first heat exchanger 116. To provide movement of air through the first and second heat exchangers 116, 118, the air movement assembly 120 is disposed below the second heat exchanger 118. The air movement assembly 120 includes a plurality of fan units 148, e.g., six fan units, which are separated from one another by partition plates 150. The air movement assembly 120 is configured to move air toward the second heat exchanger 118 so that the air travels through the second heat exchanger and then through the first heat exchanger 116.

With the placement of the cooling unit 108 above the hot aisle 104, the fan units 148 draw hot air from the hot aisle, and direct the hot air through the first and second heat exchangers 116, 118. Airflow is cooled by the first and second heat exchangers 116, 118, and is then discharged to leave the cooling unit 108 toward the ceiling of the data center 100 or to a dedicated duct provided above the cooling unit to exhaust and channel the cooled air to desired portions of the data center. Preferably, the cooled air is directed to the fronts of the equipment racks 102.

Figure 3:
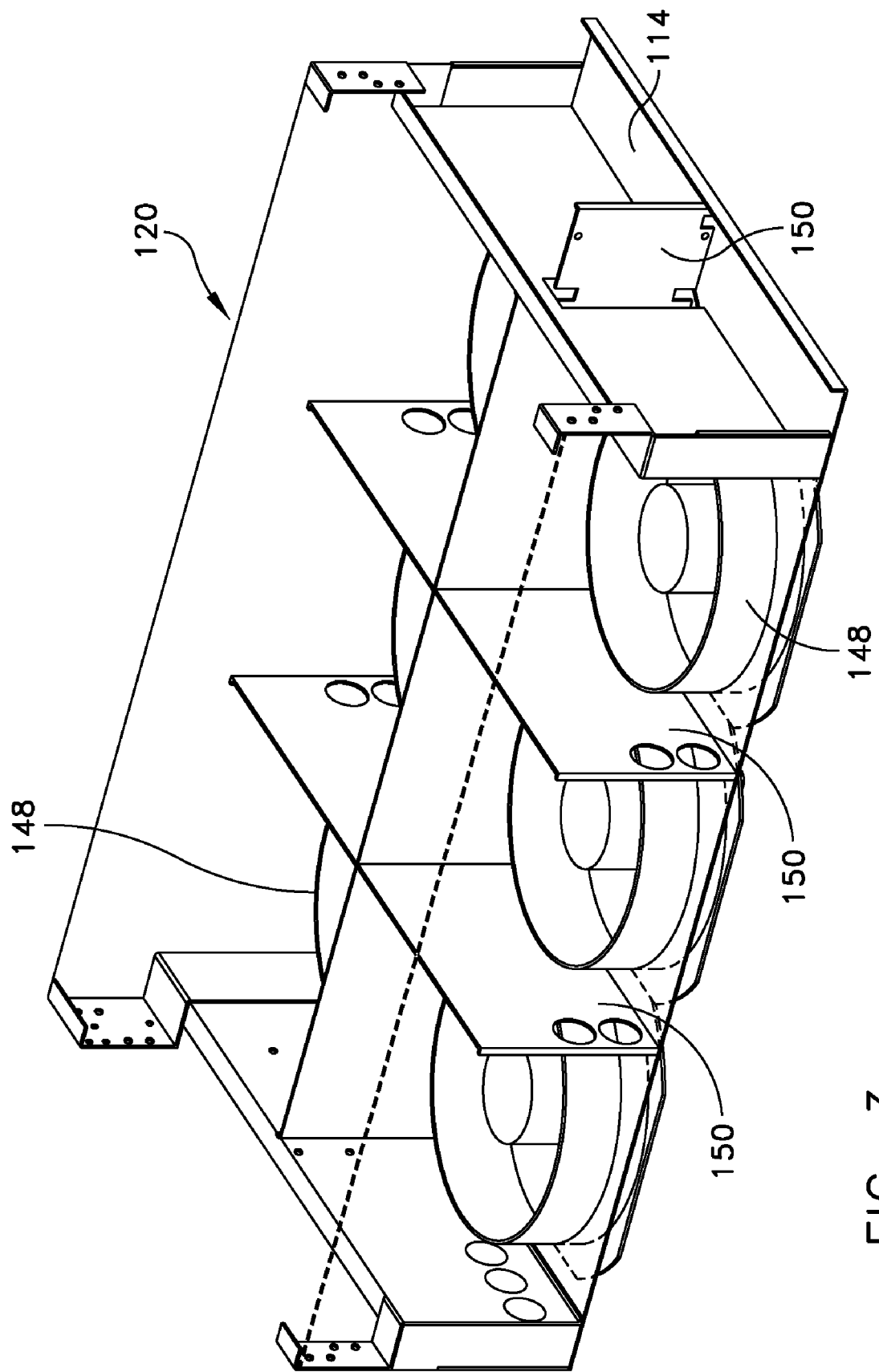
FIG. 3 is a perspective view of the cooling unit shown in FIG. 2 with heat exchangers of the cooling unit removed to reveal air movement devices of the cooling unit.

As shown in FIGS. 2 and 3, the partition plates 150 are located in the space of between fan units 148 and the second heat exchanger 118. The partition plates 150 divide the fan discharge area and the cooling surface of the heat exchangers 116, 118 into six separate rectangle zones. Although six fan units 148 are illustrated, any number of fan units may be provided to move air across the second heat exchanger 118 and the first heat exchanger 116. Each fan unit 148 discharges airflow to its own discharge zone, and airflow is then delivered to a corresponding enter zone on the cooling coil surface of the second heat exchanger 118. This configuration forms six separate internal airflow branches between fan units 148 and the second heat exchanger 118, thereby increasing the efficiency of the cooling unit 108.

Figure 4:
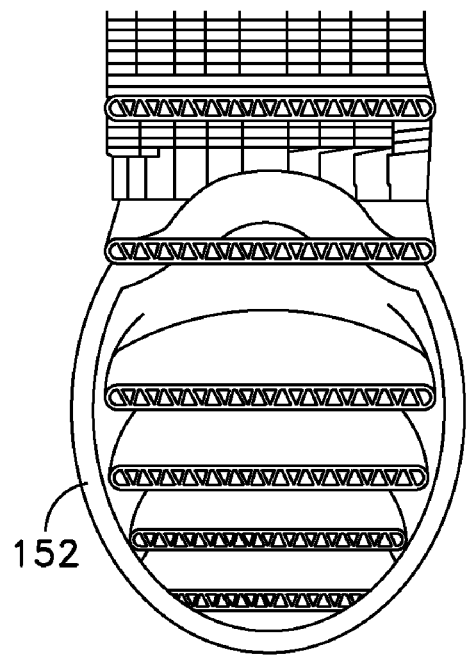
FIG. 4 is an enlarged cross-sectional view of one embodiment of micro channel coils of the cooling unit.
Figure 5:
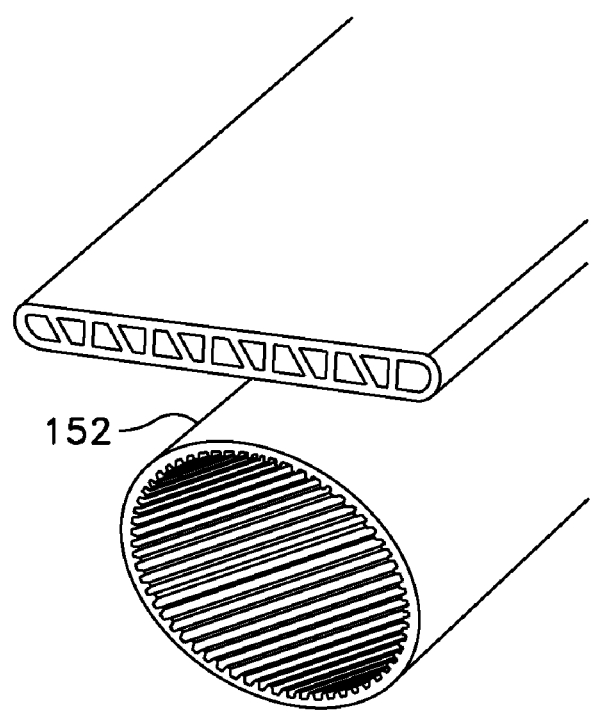
FIG. 5 is an enlarged cross-sectional view of another embodiment of the micro channel coils of the cooling unit.

Referring to FIGS. 4 and 5, embodiments of the construction of micro channel coils are illustrated. In one embodiment, a portion of the cooling unit includes a ladder-type structure having a pair of larger pipes spaced apart from one another with smaller micro channel coils extending between the larger pipes. In one example, the arrangement is such that chilled coolant enters the cooling unit by the supply line. Once within the heat exchanger of the cooling unit, chilled coolant enters and flows through the micro channel coils. The exteriors of the micro channel coils have fins that absorb heat from warm air flowing toward the cooling unit thereby heating the coolant flowing through the micro channel coils. The warmed coolant is exhausted into the return line. FIG. 4 illustrates one embodiment of the micro channel coil structure 152 in which the coils include fins that are disposed in a desired direction. FIG. 5 illustrates another embodiment of the micro channel coil structure 152.

Figure 6:
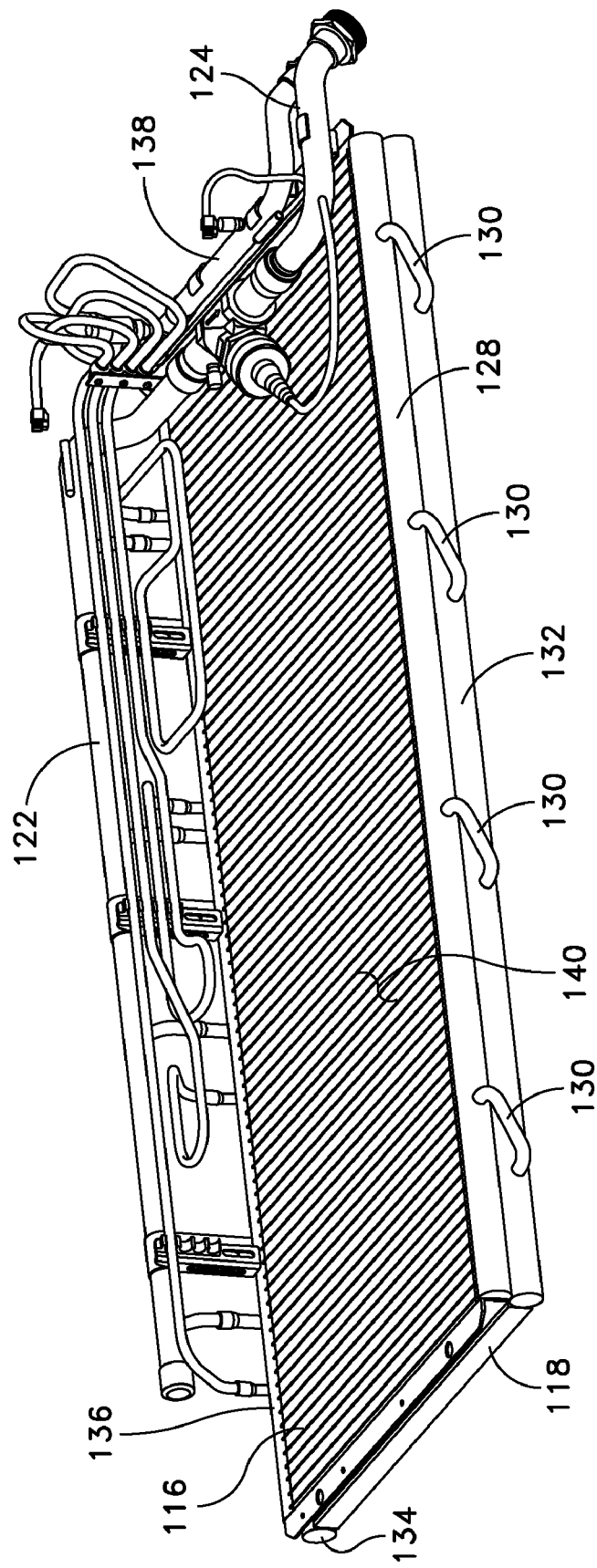
FIG. 6 is a perspective view of the cooling unit shown in FIGS. 2 and 3 illustrating heat exchangers of another embodiment.

FIG. 6 illustrates an embodiment of the first and second heat exchangers 116, 118 with the piping more clearly illustrated. It should be noted that although the size and shape of the heat exchangers 116, 118 illustrated in FIG. 6 are slightly different than the heat exchangers illustrated in FIG. 2, the first and second heat exchangers are otherwise identical. Accordingly, the reference numbers used to describe the heat exchangers 116, 118 in FIG. 2 are used to describe the heat exchangers in FIG. 6.

As shown, refrigerant enters into the secondary dual inlet coil header 122 by the refrigerant supply line 124, which may be connected to the refrigerant distribution unit. The refrigerant passes from the secondary dual inlet coil header 122 to the inlet coil header manifold 126. After further mixing in the inlet coil header manifold 126, refrigerant is uniformly distributed into micro channels, such as the micro channel coil structures 152 illustrated in FIGS. 4 and 5, of the first heat exchanger 116. The refrigerant travels through the first heat exchanger 116 until it reaches the outlet header manifold 128 provided at an exit of the first heat exchanger. Several U-shaped connectors 130 transfer the two-phase mixture of refrigerant from the first heat exchanger 116 to the inlet coil header manifold 132 of the second heat exchanger 118. The refrigerant becomes a superheated gas at end of the second heat exchanger 118. The vaporized refrigerant is collected by the outlet header manifold 134 of the second heat exchanger 118, which is then transferred into a secondary dual outlet coil header 136 provided at the end of the second heat exchanger. The return line 138 returns the superheated gas to the refrigerant distribution unit.

The arrangement is such that refrigerant entering the first heat exchanger 116 is gradually heated as the refrigerant travels across the width of the first heat exchanger to the outlet header manifold 128. The heated two-phase refrigerant travels into the second heat exchanger 118 by the connectors 130 and is gradually super heated as the refrigerant travels to the outlet header manifold 134. Thus, the resultant temperature of air travelling through the second heat exchanger 118 and the first heat exchanger 116 by each fan unit 148 is substantially uniform across the width of the cooling unit 108.

Figure 7:
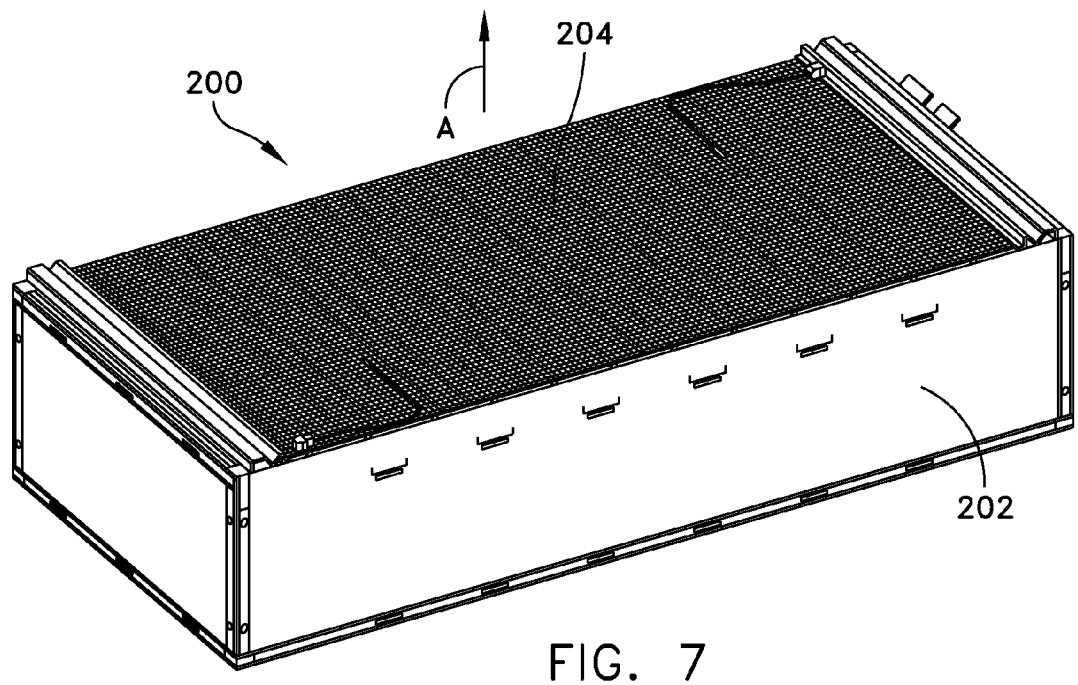
FIG. 7 is a top perspective view of a cooling unit of another embodiment of the disclosure.
Figure 8:
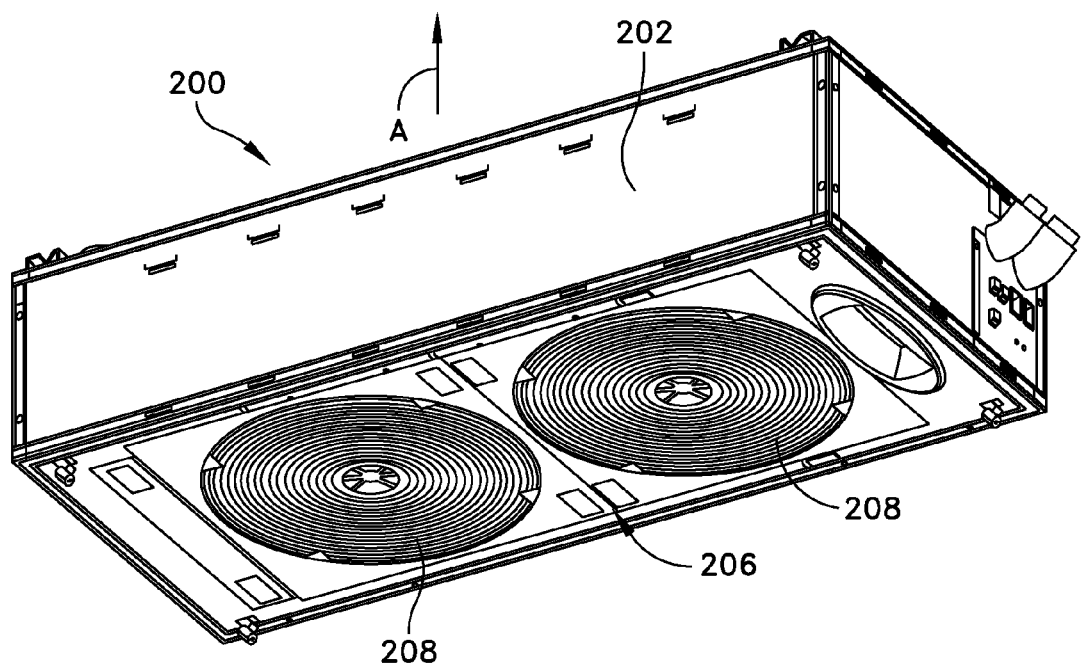
FIG. 8 is a bottom perspective view of the cooling unit shown in FIG. 7.

FIGS. 7 and 8 illustrate a cooling unit generally indicated at 200 of another embodiment of the disclosure. As shown, the cooling unit 200 comprises a housing 202 designed to secure the working components of the cooling unit. The cooling unit 200 includes a heat exchanger 204 (FIG. 7) and an air movement assembly generally indicated at 206 (FIG. 8), both of which are secured to and contained within the housing 204. As with cooling unit 108, the air movement assembly 206 is configured to move air across the heat exchanger 204. Specifically, the air movement assembly 206 includes a plurality of fan units 208, e.g., two fan units, connected to the housing 202. With the placement of the cooling unit 200 above the hot aisle 104, the fan units 208 draw hot air from the hot aisle, and direct the hot air through the heat exchanger 204. Airflow is cooled by the heat exchanger 204, and is then discharged to leave the cooling unit 200 toward the ceiling of the data center 100 or to a dedicated duct provided above the cooling unit to exhaust and channel the cooled air to desired portions of the data center. Preferably, the cooled air is directed to the fronts of the equipment racks 102.

Although two fan units 208 are illustrated in FIG. 8, any number of fan units may be provided to move air across the heat exchanger 204. Each fan unit 208 discharges airflow to its own discharge zone, and airflow is then delivered to a corresponding enter zone on the cooling coil surface of the heat exchanger 204. Air flows through the cooling unit 200 from the bottom to the top of the cooling unit in a vertical direction defined by arrow A. As shown, the heat exchanger 204 includes a body having a first (upwardly facing) surface and a second, opposing (downwardly facing) surface. As shown in FIG. 8, the air movement assembly 206 is disposed below the heat exchanger.

Figure 9:
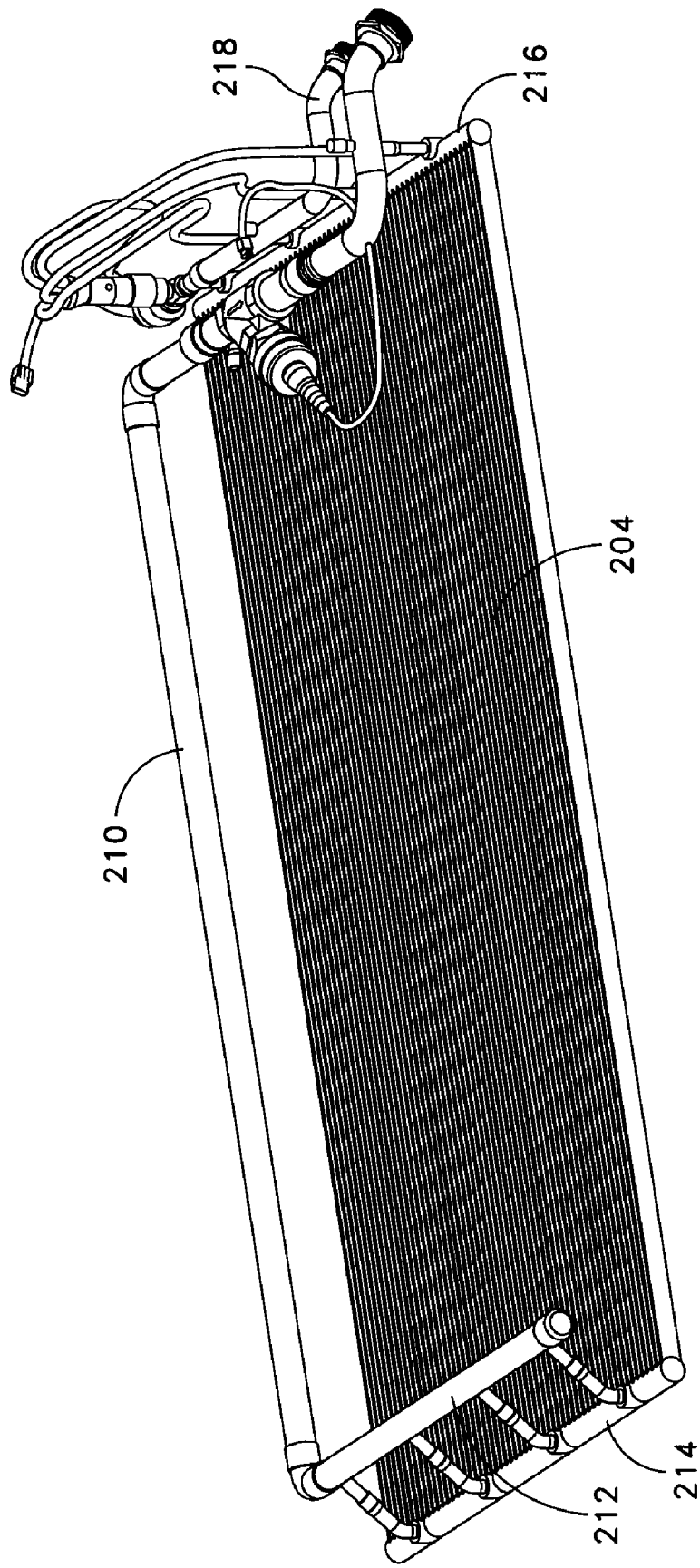
FIG. 9 is a perspective view of the cooling unit shown in FIGS. 7 and 8 illustrating a heat exchanger of the cooling unit.

Referring to FIG. 9, a supply line 210 delivers refrigerant to a secondary dual inlet coil header 212 of the cooling unit 200. The refrigerant is pre-mixed in the secondary dual inlet coil header 212, and then is divided into four branches to flow into an inlet coil header manifold 214 of the cooling unit 200 at locations along the inlet coil header manifold. After further mixing in the inlet coil header manifold 214, refrigerant is uniformly distributed into micro channels of the heat exchanger 204. Once refrigerant enters the heat exchanger 204, the refrigerant is evaporated in the heat exchanger. The refrigerant travels through the heat exchanger 204 until it reaches an outlet header manifold 216 provided at an exit of the heat exchanger. The outlet header manifold 216 is in fluid communication with a return line 218, which returns the superheated gas to a refrigerant distribution unit.

Figure 10:
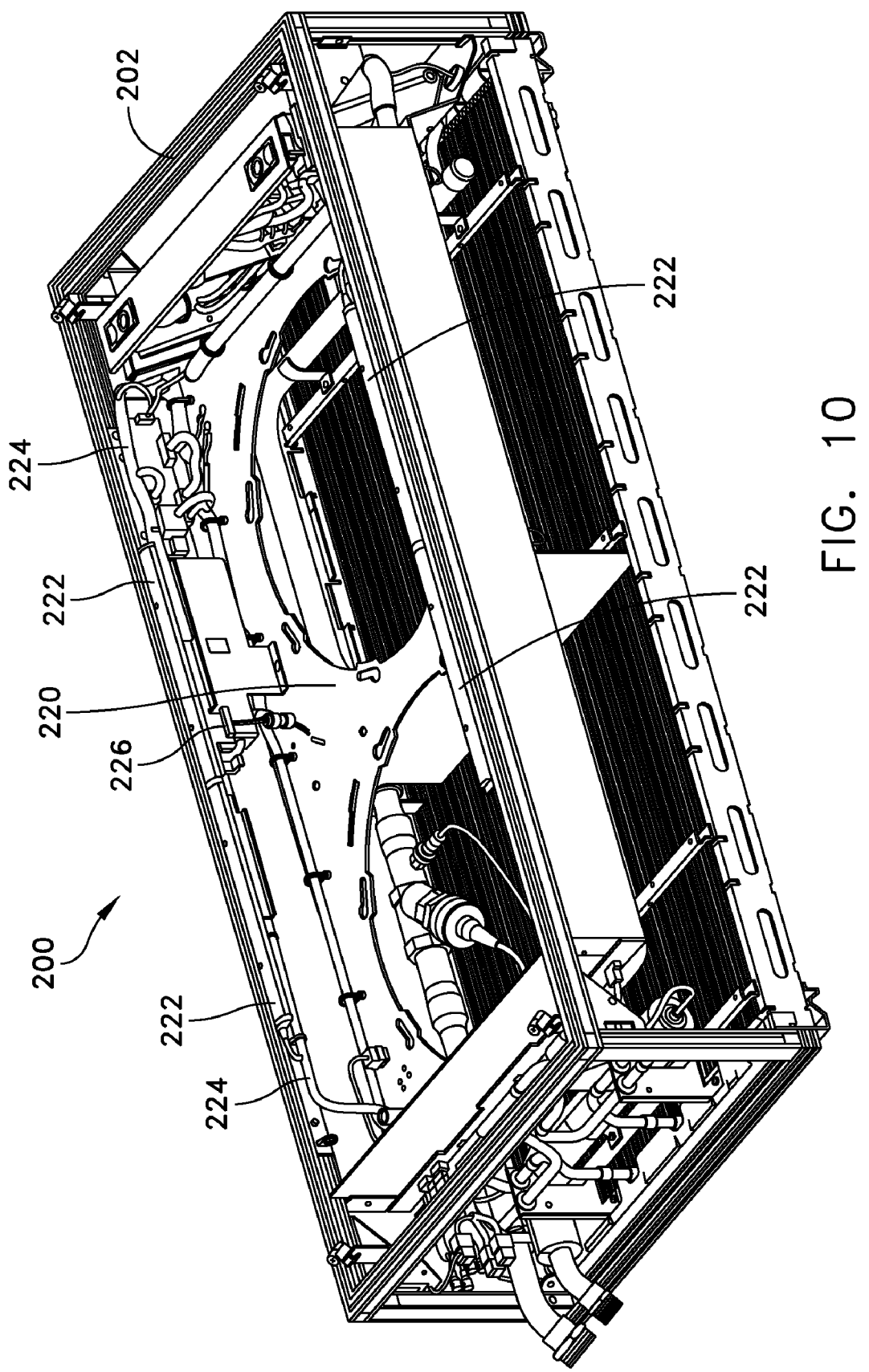
FIG. 10 is a reversed perspective view of the cooling unit shown in FIG. 8 with fan units and housing components of the cooling unit removed to illustrate an interior of the cooling unit.

FIG. 10 shows the housing 202 with covers of the housing removed to view the interior of the housing. The fan units 208 are also removed. As shown, the housing 202 includes a support bracket 220 configured to support each fan unit 208. The manner in which the fan units are secured to the housing may be found in U.S. patent application Ser. No. 12/474,094, entitled METHOD AND APPARATUS FOR ATTACHMENT AND REMOVAL OF FANS WHILE IN OPERATION AND WITHOUT THE NEED FOR TOOLS, by Roy Grantham, filed on even date herewith, which is incorporated herein by reference in its entirety for all purposes. It should be understood that although the support bracket 220 is configured to support two fan units 208, the support bracket may be configured to accommodate any number of fan units.

Embodiments of the cooling unit may include one or more light sources to illuminate the hot aisle 104. Since cooling units and/or filler panels may be configured to completely enclose the hot aisle, the cooling units block any natural or artificial light associated with the data center. Thus, it may be desirable to include one or more light sources with the cooling units 108 and 200 to illuminate the hot aisle. In one embodiment, with reference to FIG. 10 and cooling unit 200, the cooling unit includes several light assembly modules, each indicated at 222. Suitable wiring 224 is provided to provide electrical power connection to the light assembly modules 222. A magnetic switch set 226 is provided to control the operation of the light assembly modules 222. The arrangement is such that the controller of the cooling units may be manipulated to control the operation of the cooling units, including the speed of fans of the fan units, the flow of refrigerant through the heat exchangers, and the operation of the light modules. It should be understood that the controller may be a dedicated device associated with each cooling unit, or part of the overall control network associated with the data center.

Figure 11:
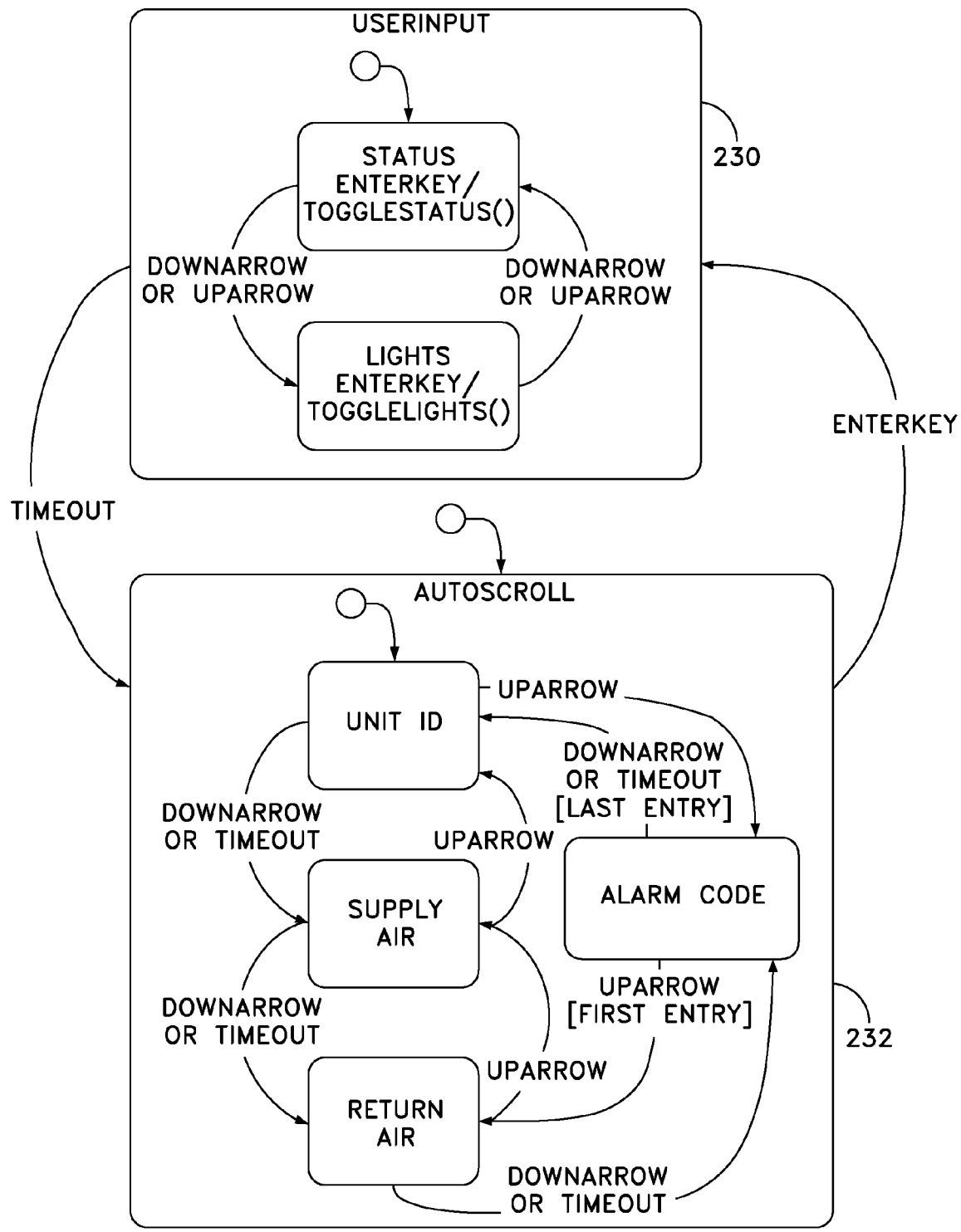
FIG. 11 is a flow chart showing the operation of a cooling unit of an embodiment of the disclosure.

Referring to FIG. 11, the operation of the cooling units (108 or 200) may be controlled by a remote control function designated by block 230 and an auto-scroll function designated by block 232. The remote control function 230 may be used by the operator to control various functions of the cooling units. By using scroll-up and scroll-down functions of a remote control, the operator may scroll through features associated with the cooling units, for example, to control the cooling operation of a particular cooling unit, operate light assembly modules of the cooling units, check the status of one or more cooling unit, etc. When not using the remote control, and after a predetermined period of time, the operation of the cooling units may be controlled by the auto-scroll function 232. In one embodiment, the auto-scroll function 232 is controlled by a display associated with the cooling units. The display may be provided within the hot aisle 104 or anywhere within the data center 100. As with the remote control function 230, the auto-scroll function 232 may be manipulated by using scroll-up and scroll-down functions provided on the display to control the operation of a particular cooling unit, operate light assembly modules of the cooling units and check the status of one or more cooling unit. In addition, the auto-scroll function 232 may be used to control the operation of an alarm code, which may be set by the operator to indicate a failure of one or more cooling functions within the data center.

Figure 12:
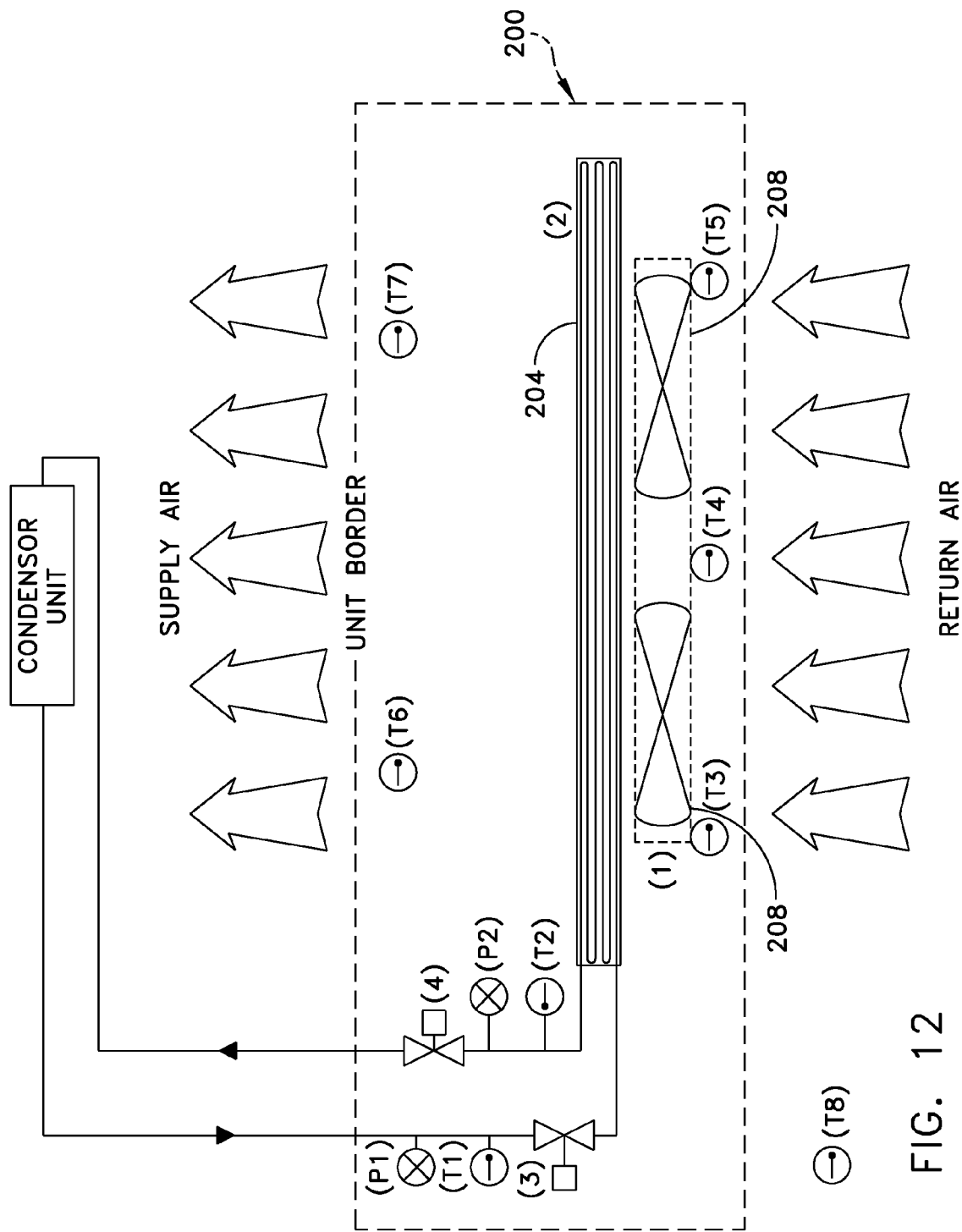
FIG. 12 is a schematic block diagram showing the airflow through a cooling unit.

FIG. 12 is a schematic block diagram showing the airflow through a cooling unit, such as cooling unit 200. As shown, warm air is directed to the cooling unit 200 by the fan units 208. The warm air travels through the heat exchanger 204 and is cooled by the heat exchanger. The cooled air travels back to data center where the cycle begins again. FIG. 12 illustrates the heat exchanger 204 (or evaporator) in fluid communication with a condenser unit (not designated). A pump and expansion valves are provided to complete the circuit of refrigerant within the cooling unit.

Methods of cooling a hot aisle defined by two rows of equipment racks of a data center are further disclosed. In one embodiment, the method includes containing air within the hot aisle of the data center with one or more cooling units configured to span the hot aisle, and cooling air contained within the hot aisle by the cooling unit. When cooling air contained within the hot aisle, air is moved toward a heat exchanger of the cooling unit. When employing cooling unit 108, the arrangement is such that air is moved toward the second heat exchanger through the second surface of the second heat exchanger and through the second surface of the first heat exchanger.

Thus, it should be observed that the air containment cooling system of embodiments of the disclosure provides a domed cooling coil above the hot aisle that significantly increases the heat exchanger surface area to increase the cooling capacity of the system. In certain embodiments, multiple air containment cooling systems may be joined together so that they share common vertical support members. In addition, when joining multiple air containment cooling systems together to form a longer row, interior doors (not shown) may be provided between adjacent systems to better segregate airflow and capacity allocation within the hot aisle.

In addition, when compared to a conventional tube-fin coil, a micro channel coil heat exchanger performs high heat transfer efficiency at a compact size. The advantage of the micro channel heat exchanger enables a relatively large cooling capacity within a limited space.

Due to high overall heat transfer coefficient, the micro channel coil heat exchanger is made in less rows and lower fin density as compared to a conventional tube-fin coil. Airflow static pressure differential across the heat exchanger is significantly reduced. The fan units enable large airflow rate and small static pressure lift. To enhance the cooling capacity, the micro channel coil heat exchanger is assembled by first and second heat exchangers in conjunction with U-shape intermediate coil connector between the two heat exchangers. This enables "two passes" of hot air over the second heat exchanger and the first heat exchanger, while maintaining a good coil cooling efficiency.

To optimize refrigerant liquid distribution uniformity, the dual inlet secondary coil headers are added to coil inlet and outlet coil header manifolds. The secondary coil headers significantly improve the refrigerant flow uniformity in micro channels of the first and second heat exchangers.

To prevent condensation from forming on the first and second heat exchangers, the evaporating temperature is controlled to be above air dew point.

The fan units are designed to minimize external fan noise, and relieve airflow discharge strength to ceiling. The fan units are arranged in a two by three column, which optimizes the balance between number of fan units and airflow uniformity on coil surfaces of the heat exchangers.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A cooling system for containing and cooling air, the cooling system comprising:
   two rows of equipment racks defining a hot aisle;
   a housing configured to be mounted on the two rows of equipment racks such that the housing spans the hot aisle above the hot aisle;
   a first heat exchanger supported by the housing and coupled to and in fluid communication with a coolant supply and an intermediate coolant connector, the first heat exchanger including a first body having a first surface and a second surface, the second surface opposing the first surface;

a second heat exchanger coupled to and in fluid communication with the intermediate coolant connector and a coolant return, the second heat exchanger including a second body having a third surface and a fourth surface, the fourth surface opposing the third surface, wherein the first heat exchanger is disposed above the second heat exchanger and the third surface of the second heat exchanger faces the second surface of the first heat exchanger; and an air movement assembly supported by the housing, the air movement assembly being positioned below the second heat exchanger and configured to move air over the second heat exchanger and the first heat exchanger.

2. The cooling system of claim 1, further comprising a first header coupled to the heat exchanger and the coolant supply, the first header being configured to distribute coolant to the first heat exchanger.

3. The cooling system of claim 2, further comprising a second header coupled to the second heat exchanger and the coolant return.

4. The cooling system of claim 1, wherein the air movement assembly includes at least one fan unit.

5. The cooling system of claim 4, wherein the at least one fan unit is separated from another fan unit by a partition plate.

6. The cooling system of claim 1, wherein the first and second heat exchangers each comprise micro channel coils.

7. The cooling system of claim 1, further comprising at least one light assembly module coupled to the housing.

8. The cooling system of claim 1, further comprising a remote control to control the operation of the cooling system.

9. A method of cooling a hot aisle defined by two rows of equipment racks of a data center, the method comprising:

containing air within the hot aisle of the data center with one or more cooling units configured to span the hot aisle; and cooling a portion of the air contained within the hot aisle by the one or more cooling units, wherein the cooling the portion of the air contained within the hot aisle includes moving the portion of the air toward a heat exchanger unit of each of the one or more cooling units, wherein the heat exchanger unit of the each of the one or more cooling units comprises a first heat exchanger including a first body having a first surface and a second surface, the second surface opposing the first surface, and a second heat exchanger including a second body having a third surface and a fourth surface, the fourth surface opposing the third surface, and the third surface of the second heat exchanger faces the second surface of the first heat exchanger, and wherein the moving the portion of the air toward the heat exchanger unit includes moving the portion of the air toward the second heat exchanger through the fourth surface of the second heat exchanger and toward the first heat exchanger through the second surface of the first heat exchanger.

10. The method of claim 9, further comprising illuminating the hot aisle.

11. The method of claim 9, further comprising controlling the operation of the each of the one or more cooling units with a remote control.

\* \* \* \* \*